(12) United States Patent
Rosenblatt et al.

(10) Patent No.: US 7,690,104 B2
(45) Date of Patent: Apr. 6, 2010

(54) TECHNIQUE FOR REDUCING WASTED MATERIAL ON A PRINTED CIRCUIT BOARD PANEL

(75) Inventors: Michael N. Rosenblatt, Campbell, CA (US); Amir Salehi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/062,855

(22) Filed: Apr. 4, 2008

(65) Prior Publication Data

US 2009/0205200 A1   Aug. 20, 2009

Related U.S. Application Data

(60) Provisional application No. 61/030,079, filed on Feb. 20, 2008.

(51) Int. Cl.
| | |
|---|---|
| H05K 3/36 | (2006.01) |
| H05K 3/00 | (2006.01) |
| H05K 3/30 | (2006.01) |
| H05K 3/34 | (2006.01) |
| H05K 1/00 | (2006.01) |
| H05K 1/03 | (2006.01) |
| H01R 12/00 | (2006.01) |

(52) U.S. Cl. .............................. 29/830; 29/829; 29/834; 29/840; 174/254; 174/255; 439/65

(58) Field of Classification Search .................. 29/829, 29/830, 834, 840; 174/254, 255; 439/65–69; 349/150; 228/180.1–180.22
See application file for complete search history.

(56) References Cited

U.S. PATENT DOCUMENTS

| 5,777,855 | A | * | 7/1998 | Yokajty ........................ 361/803 |
|---|---|---|---|---|
| 5,920,465 | A | * | 7/1999 | Tanaka ........................ 361/784 |
| 5,954,536 | A | * | 9/1999 | Fuerst et al. ................. 439/493 |
| 6,139,357 | A | * | 10/2000 | Shih ............................ 439/493 |
| 6,223,973 | B1 | * | 5/2001 | Wong et al. ............... 228/180.1 |
| 6,399,890 | B1 | * | 6/2002 | Poulter et al. ................ 174/255 |
| 6,581,278 | B2 | * | 6/2003 | Kay ............................. 29/830 |
| 2008/0080154 | A1 | * | 4/2008 | Tagano et al. ............... 361/775 |
| 2009/0064493 | A1 | * | 3/2009 | Kariya et al. ................. 29/829 |

* cited by examiner

*Primary Examiner*—A. Dexter Tugbang
*Assistant Examiner*—David P Angwin
(74) *Attorney, Agent, or Firm*—Park, Vaughan & Fleming LLP

(57) ABSTRACT

A process for assembling a rigid-flex printed circuit board (PCB) is presented. During operation, the process receives rigid-flex PCBs that are to be coupled together, wherein a rigid-flex PCB includes flexible PCBs coupled to rigid PCBs. The process then places the PCBs onto a carrier which is configured to: align the PCBs so that bond regions located on the flexible PCBs overlap with bond regions located on corresponding flexible PCBs, and apply pressure to the overlapped bond regions. The process then sends the carrier through a reflow oven which reflows solder on the PCBs so that the components become mechanically and electrically coupled to the PCBs. The temperature profile generated by the reflow oven and the pressure applied by the carrier cures and sets an anisotropic conductive film located in the bond regions so that the overlapped flexible PCBs become mechanically and electrically coupled together.

7 Claims, 10 Drawing Sheets

TECHNIQUE FOR REDUCING WASTED MATERIAL ON A PRINTED CIRCUIT BOARD PANEL

RELATED APPLICATION

This application hereby claims priority under 35 U.S.C. §119 to U.S. Provisional Patent Application No. 61/030,079 filed 20 Feb. 2008, entitled "TECHNIQUE FOR REDUCING WASTED MATERIAL ON A PRINTED CIRCUIT BOARD PANEL," by inventors Michael N. Rosenblatt and Amir Salehi.

BACKGROUND

1. Field of the Invention

The present invention relates to techniques for manufacturing printed circuit boards (PCBs). More specifically, the present invention relates to a method and apparatus for reducing wasted material during the process of manufacturing a PCB panel.

2. Related Art

Electronic devices typically include integrated circuit (IC) chips and other discrete electronic components which are mounted onto one or more printed circuit boards (PCBs). These electronic devices can also include other discrete components, such as a display or a battery, which are not mounted onto PCBs. The PCBs and the other discrete components are then assembled into a housing for the electronic device.

As IC technology continues to evolve, the form factor of electronic devices has decreased. As a result, the process of packaging the PCBs and the discrete components into a housing for the electronic device becomes more difficult. For example, consider a mobile phone which includes a display, a battery, a microphone, a speaker, and an antenna. The microphone and the speaker may be located at opposite ends of the mobile phone, but both components may need to be coupled to digital signal processing (DSP) chip. Similarly, the display may need to be coupled to a graphics chip. Moreover, the DSP and graphics chips may need to communicate with a general-purpose microprocessor chip. Depending on the space constraints of the housing, the chips may be located on different PCBs. In order to facilitate communication between these chips, the PCBs on which these chips reside are electrically connected to each other and the connections between these PCBs must be routed around other discrete components, such as displays, antennas, and batteries.

One solution to this routing problem is to use flexible PCBs. Unfortunately, the cost of manufacturing a rigid-flex PCB can be several times higher than the cost of manufacturing a rigid PCB. This extra cost is typically a function of the complexity of the manufacturing process (e.g., the number of machines and processing steps in the manufacturing process) and the amount of wasted space on the PCB panel. For example, FIG. 1 illustrates a PCB panel 100 which includes rigid PCBs 101-104 and flexible PCBs 105-106. In this system, flexible PCB 105 can be mechanically and electrically coupled to rigid PCB 101 through bond 107 and to rigid PCB 103 through bond 108. Similarly, flexible PCB 106 can be mechanically and electrically coupled to rigid PCB 102 through bond 109 and to rigid PCB 104 through bond 110. As illustrated in FIG. 1, the layout of PCBs 101-106 wastes a substantial amount of material, which cannot be used after the PCBs have been depanelized. For example, FIG. 2 illustrates rigid PCBs 101 and 103, and flexible PCB 105 which have been depanelized from PCB panel 100.

Hence, what is needed is a method and an apparatus for manufacturing a system which includes rigid and flexible PCBs without the problems described above.

SUMMARY

Some embodiments of the present invention provide a process for assembling a rigid-flex printed circuit board (PCB). Rigid-flex PBCs that are to be coupled together are placed into a carrier which aligns the rigid-flex PCBs so that bond regions on the rigid-flex PCBs overlap each other. When the carrier is sent through a reflow oven, the carrier generates pressure in the bond regions so that the heat and pressure cures and sets an anisotropic conductive film in the bond regions so that the rigid-flex PCBs are mechanically and electrically coupled to each other. The heat generated by the reflow oven also reflows solder so that components placed on the rigid-flex PCBs are mechanically and electrically coupled to the rigid-flex PCBs. In some embodiments, the pressure applied by the carrier is a function of temperature. For example, a composite material with a temperature-dependent expansion characteristic can be used to apply pressure to the rigid-flex PCBs.

In some embodiments, layouts for rigid-flex PCBs that are to be coupled to each can be severed at specified points so that the severed rigid-flex PCBs can be arranged on a PCB panel so that the amount of wasted space is substantially minimized. In some embodiments, after the layouts of the rigid-flex PCBs are severed, the layouts are further modified so that bond regions are created. These bond regions can be used to recouple the rigid-flex PCBs to each other.

Some embodiments of the present invention provide a carrier for assembling a rigid-flex printed circuit board (PCB). The carrier can be used to align rigid-flex PCBs which are to be coupled to each other so that bond regions on the rigid-flex PCBs overlap each other. During a solder reflow process, the carrier applies pressure to the overlapped bond regions.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description can be embodied as code, data structures, and/or data, which can be stored on a computer-readable storage medium as described above. When a computer system reads and executes the code and/or data stored on the computer-readable storage medium, the computer system performs the methods and processes embodied as code, data structures, and/or data that are stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Reducing Wasted Space on a PCB Panel

Figure 1:
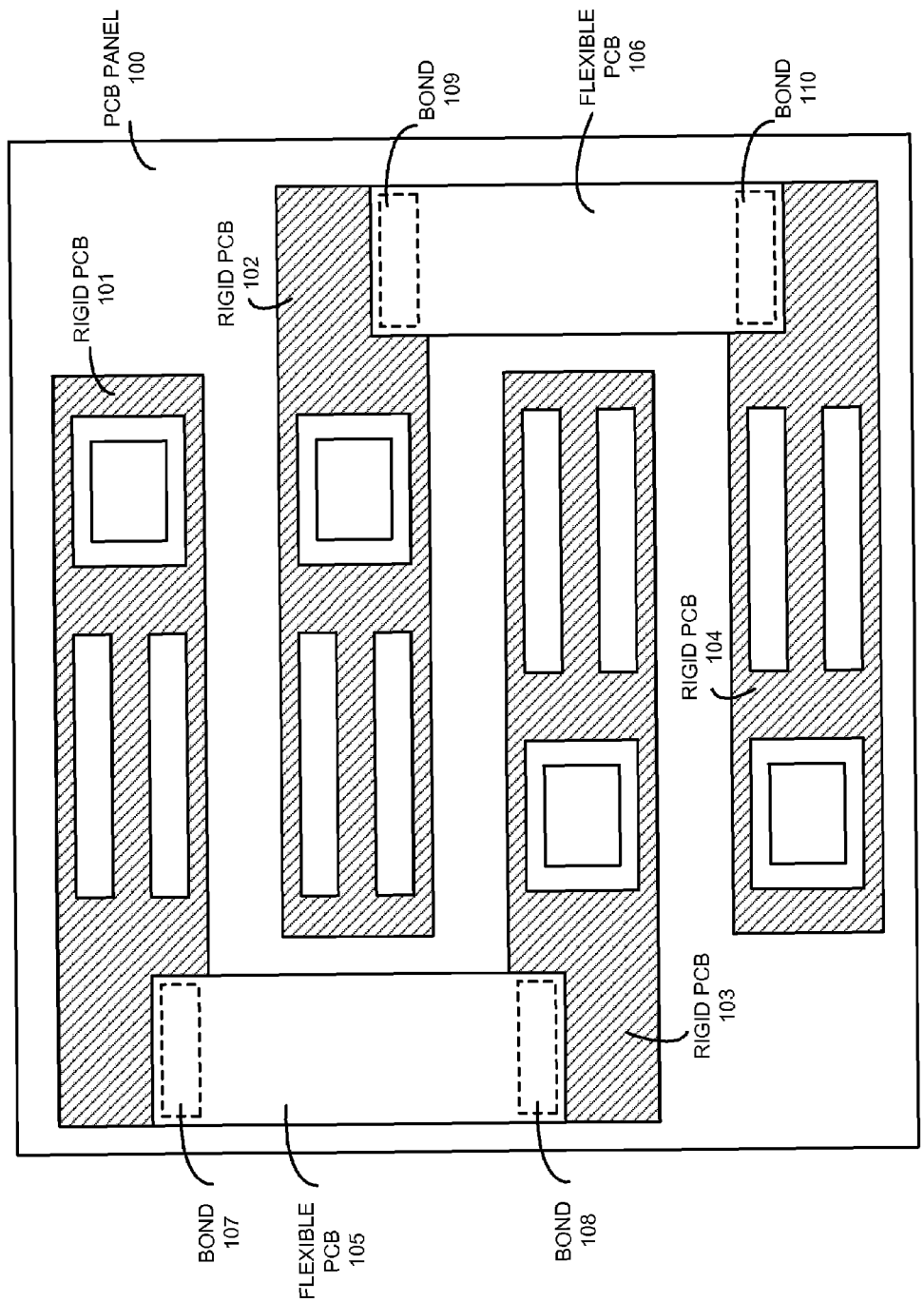
FIG. 1 illustrates a printed circuit board (PCB) panel which includes a number of PCBs.
Figure 2:
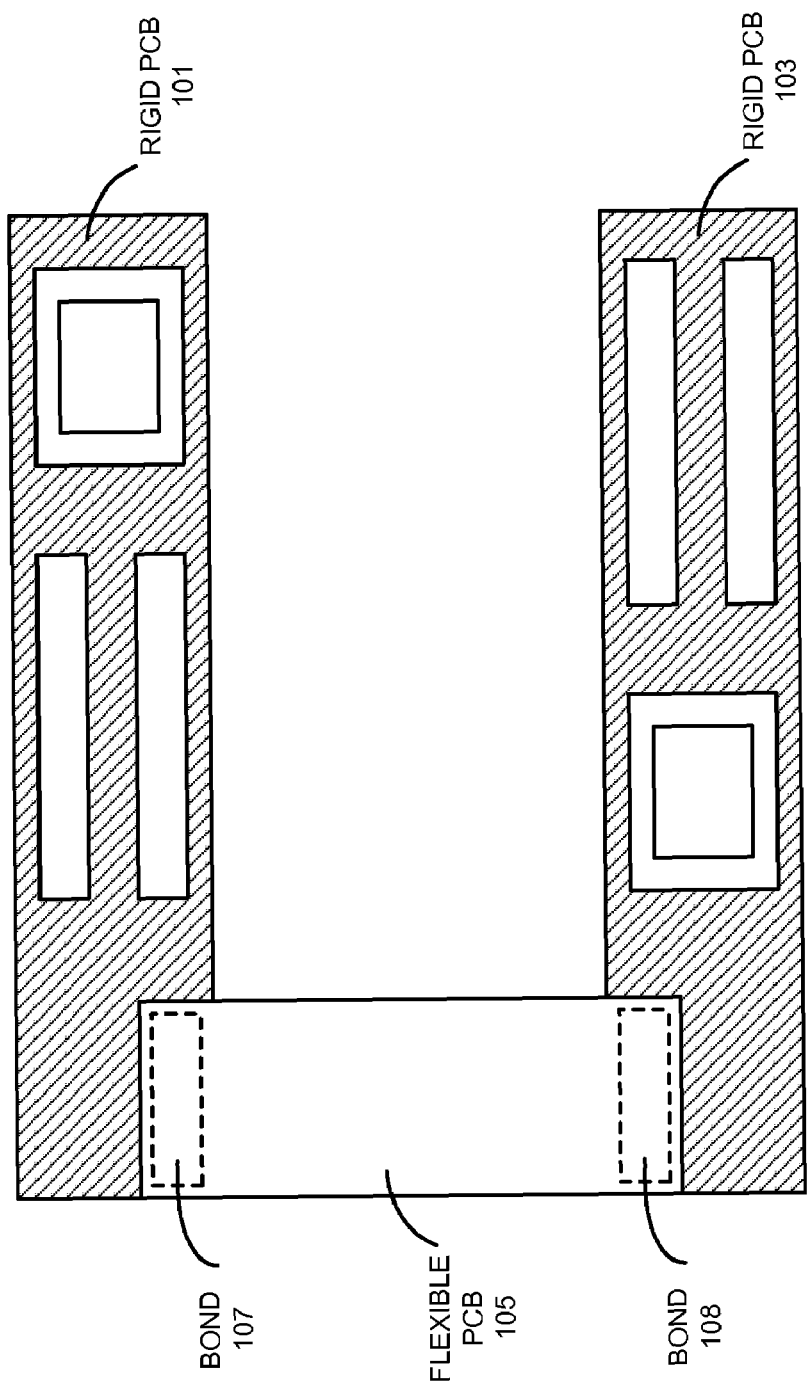
FIG. 2 illustrates a PCB which has been depanelized from the PCB panel illustrated in FIG. 1.
Figure 3:
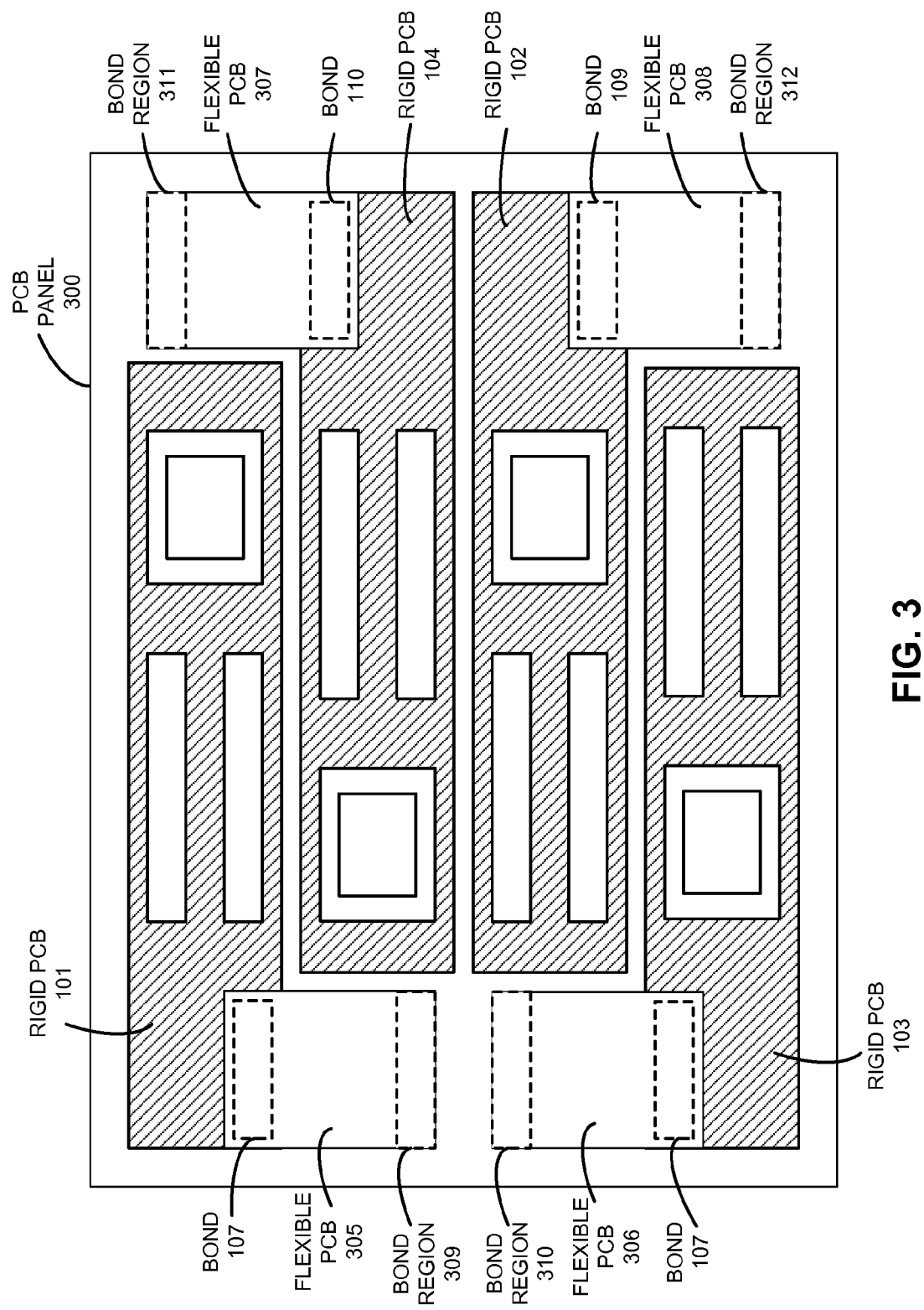
FIG. 3 illustrates a PCB panel which includes a number of PCBs in accordance with an embodiment of the present invention.

As illustrated in FIG. 1, there can be a substantial amount of wasted space on PCB panel 100. In order to reduce wasted space on a PCB panel, embodiments of the present invention sever the layouts of flexible PCBs in a rigid-flex PCB design at specified locations on the flexible PCBs so that the layouts for the PCBs in the rigid-flex PCB design can be arranged on the PCB panel to reduce the amount of wasted material on the PCB panel. For example, FIG. 3 illustrates a PCB panel 300 which includes a number of PCBs in accordance with an embodiment of the present invention. The PCBs illustrated in FIG. 3 are similar to the PCBs illustrated in FIG. 1, hence, only the differences will be discussed. As illustrated in FIG. 3, the layout of flexible PCB 105 can be severed into two separate flexible PCBs 305-306. Similarly, the layout of flexible PCB 106 can be severed into two separate flexible PCBs 307-308. The layouts for the PCBs are then rearranged so that the amount of wasted material on PCB panel 300 can be substantially reduced. Note that in general, the number of rigid PCBs and flexible PCBs in a given PCB design can vary depending on the number of components included in a given electronic device and the form factor of the housing for the electronic device. Furthermore, a given rigid PCB can be coupled to one or more flexible PCBs and a given flexible PCB can be coupled to one or more rigid PCBs. In some embodiments, after severing the layouts of the flexible PCBs, a bond region can be added to the layout of the flexible PCBs so that the severed flexible PCBs can be recoupled to each other.

Figure 4:
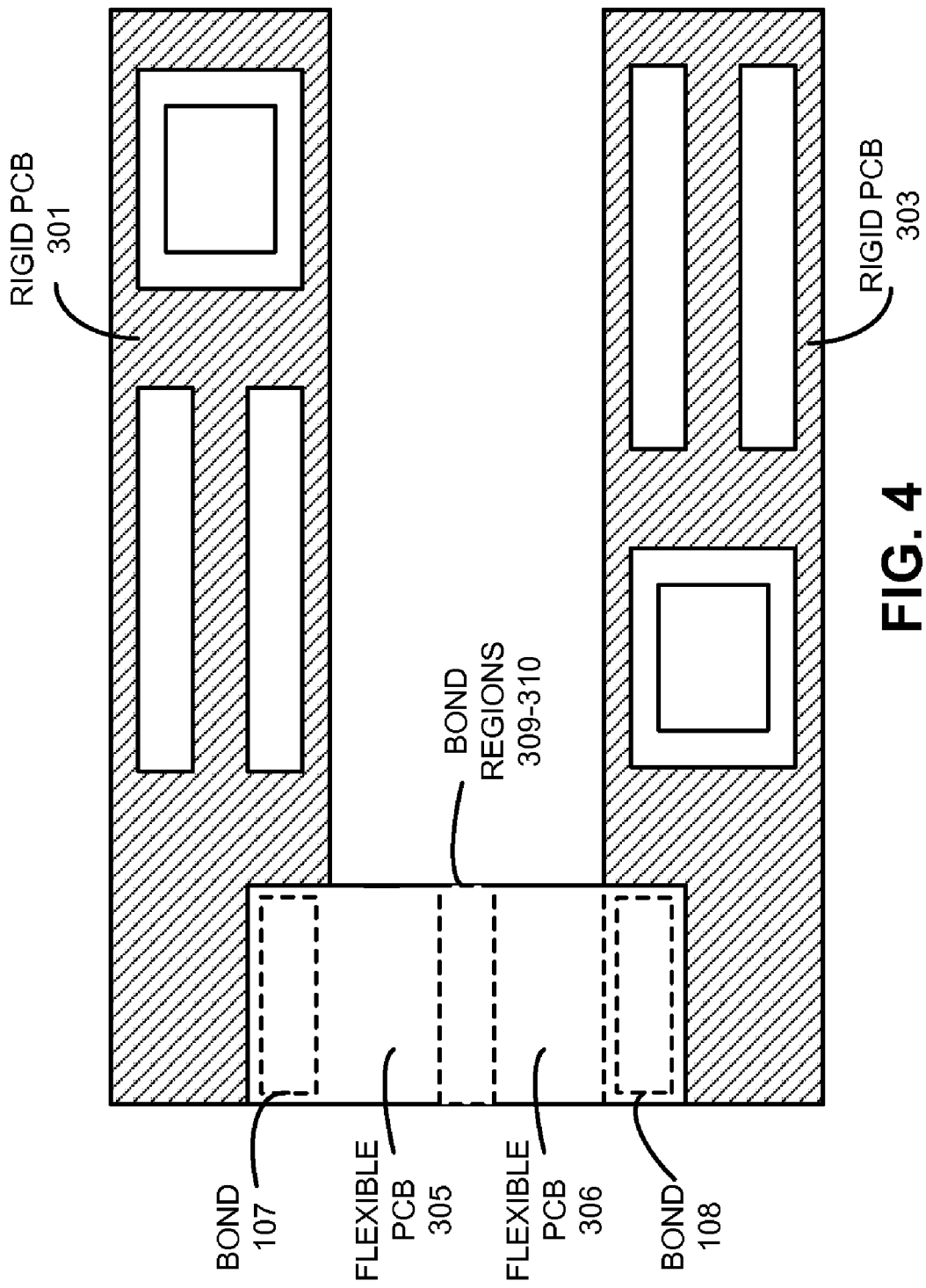
FIG. 4 illustrates a PCB which has been depanelized from the PCB panel illustrated in FIG. 3 and assembled in accordance with an embodiment of the present invention.

FIG. 4 illustrates rigid PCBs 301 and 303, and flexible PCBs 305-306 which have been depanelized from PCB panel 300 and assembled in accordance with an embodiment of the present invention. As illustrated in FIG. 4, bond region 309 on flexible PCB 305 overlaps with bond region 310 on flexible PCB 306. In some embodiments, an anisotropic conductive film (ACF), which can be used to bond flexible PCB 305 to flexible PCB 314, can be applied in the overlapping bond regions 309-310. Note that to bond flexible PCBs together, a specified temperature and pressure profile can be applied to a bond region to cure and set the ACF sandwiched between the flexible PCBs.

Figure 11:
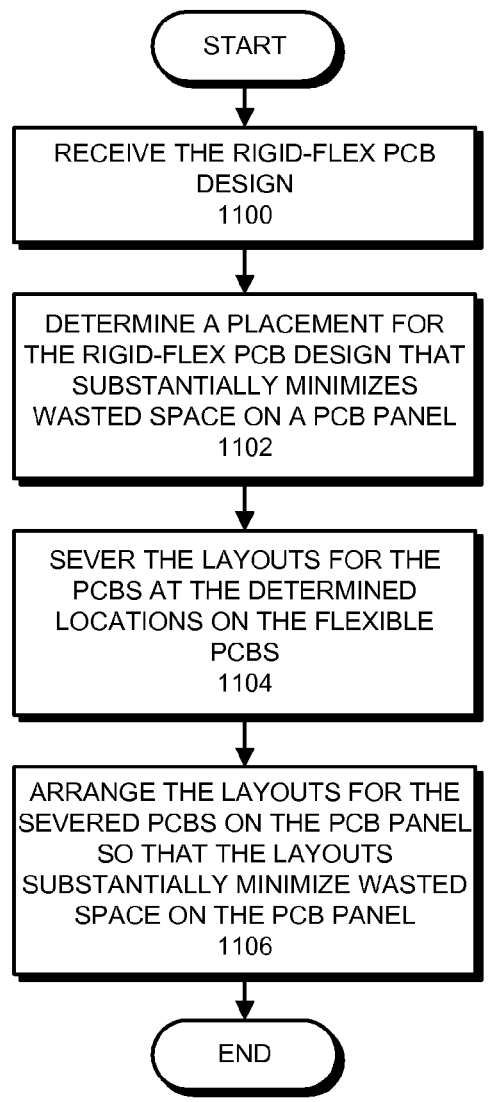
FIG. 11 presents a flow chart illustrating the process of reducing wasted material on a PCB panel in accordance with an embodiment of the present invention.

FIG. 11 presents a flow chart summarizing the process of reducing wasted material on a PCB panel in accordance with an embodiment of the present invention. The process begins when the system receives the rigid-flex PCB design (step 1100) which includes layouts for at least two rigid PCBs which are coupled to each other by flexible PCBs. The process then determines a placement for the rigid-flex PCB design that substantially minimizes wasted space on a PCB panel (step 1102), wherein determining the placement for the rigid-flex PCB design involves determining locations on the layouts for the flexible PCBs which can be severed so that the layouts for the at least two rigid PCBs are no longer coupled to each other. Next, the process severs the layouts for the PCBs at the determined locations on the flexible PCBs (step 1104). The process then arranges the layouts for the severed PCBs on the PCB panel so that the layouts substantially minimize wasted space on the PCB panel (step 1106). By doing so, the size of a PCB panel for a given PCB design can be reduced, thereby reducing the cost of materials used to manufacture the given PCB design.

Manufacturing Rigid-Flex PCBs

After the layout of the PCBs on the PCB panel has been determined (e.g., so that the wasted material on the PCB panel can be reduced), the PCB can then be manufactured. Some embodiments of the present invention use the heat generated by a solder reflow oven along with pressure generated by a carrier to cure and set the ACF so that the flexible PCBs become mechanically and electrically coupled to each other. In doing so, a separate ACF bonding process and/or machine is not needed, thereby saving manufacturing time and cost.

Figure 5A:
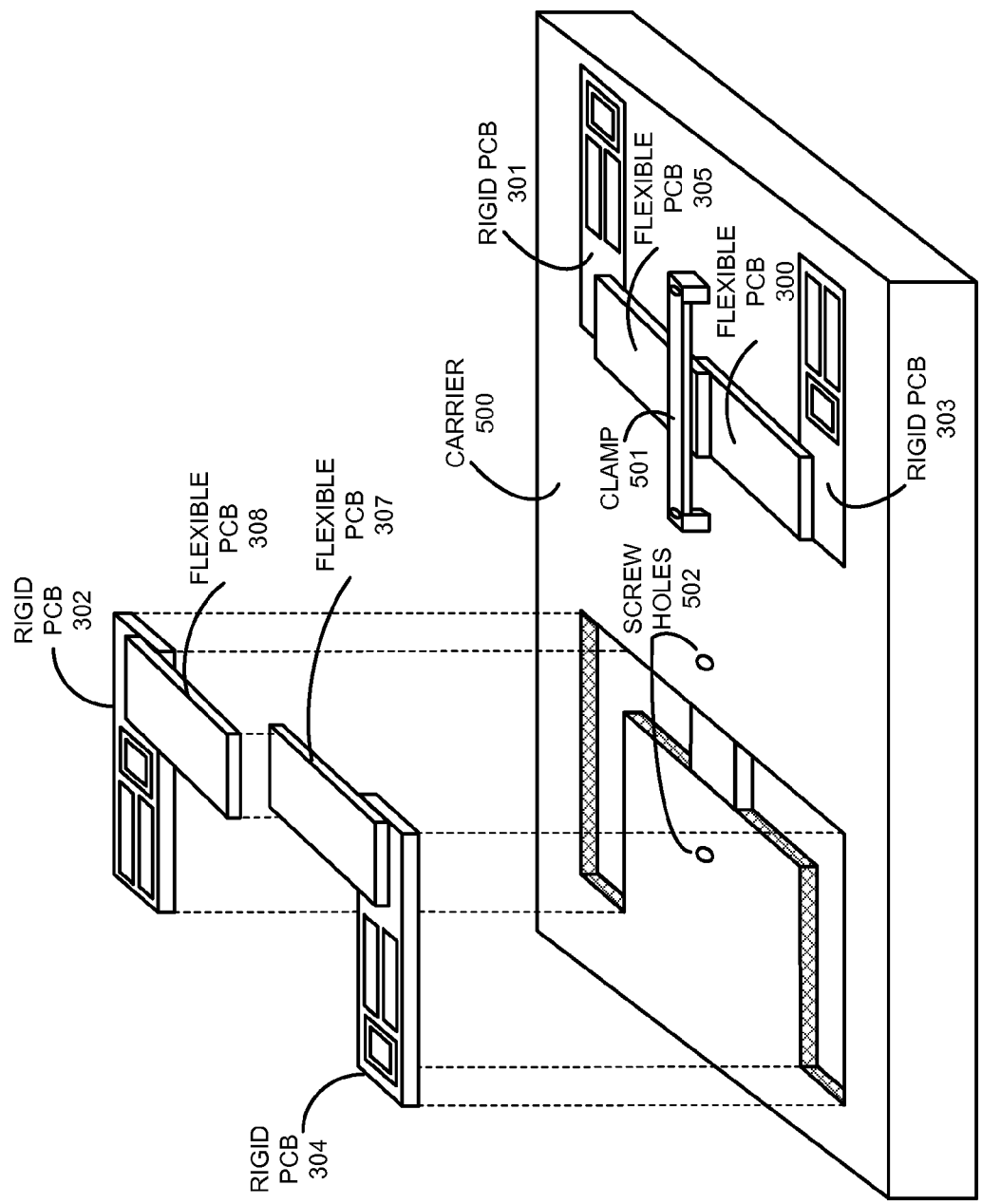
FIG. 5A illustrates an exemplary carrier for a solder reflow process in accordance with an embodiment of the present invention.

FIG. 5A illustrates an exemplary carrier 500 for a solder reflow process in accordance with an embodiment of the present invention. As illustrated in FIG. 5A, the PCBs illustrated in FIG. 3 have been depanelized and are being inserted into carrier 500. In some embodiments, carrier 500 can be configured to align the depanelized PCBs so that bond regions on the flexible PCBs overlap. Note that the alignment mechanism illustrated in FIGS. 5A-5B are presented for illustrative purposes only and that any alignment mechanism now known or later developed can be used to align the CPBs so that bond regions located on the flexible PCBs overlap bond region on corresponding flexible PCBs.

In some embodiments, a pressure-applying mechanism on carrier 500 can be used to apply pressure to the flexible PCBs during the solder reflow process. As mentioned above, the heat from the reflow process and the pressure from the pressure-applying mechanism cures and sets the ACF so that the bond regions on the flexible PCBs are mechanically and electrically coupled to each other. In some embodiments, the pressure exerted by the pressure-applying mechanism can be constant (e.g., invariant with temperature). As illustrated in FIG. 5A, a clamp (e.g., clamp 501) provides pressure to the overlapped bond regions. The clamp can be secured to carrier 500 using screws (e.g., located at screw holes 502) or any other mechanism to secure objects to a PCB now known or later developed. In some embodiments, the pressure-applying mechanism can include one or more of: a screw; a wing nut; a latch; and a clamp.

Figure 5B:
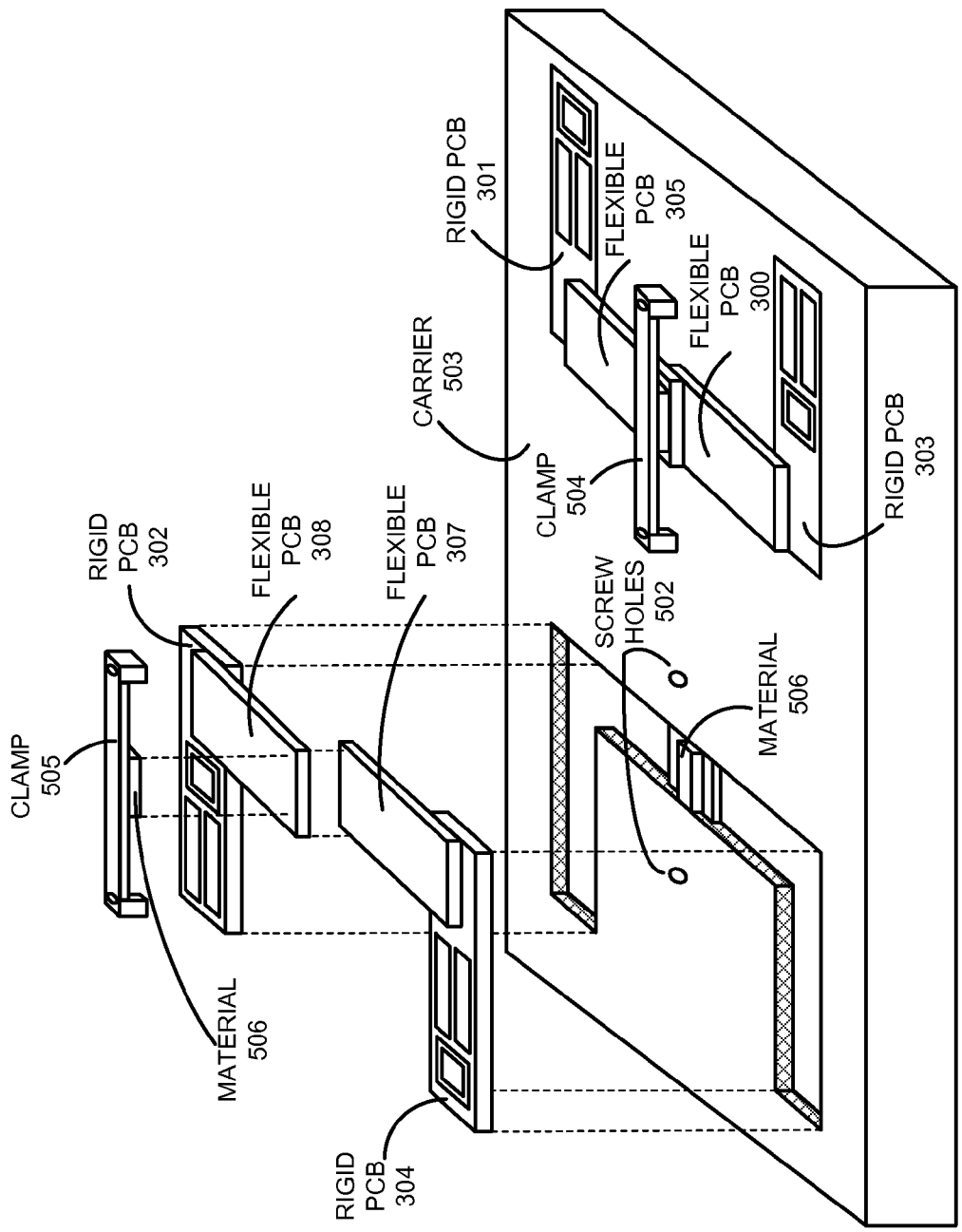
FIG. 5B illustrates another exemplary carrier for a solder reflow process in accordance with an embodiment of the present invention.
Figure 6:
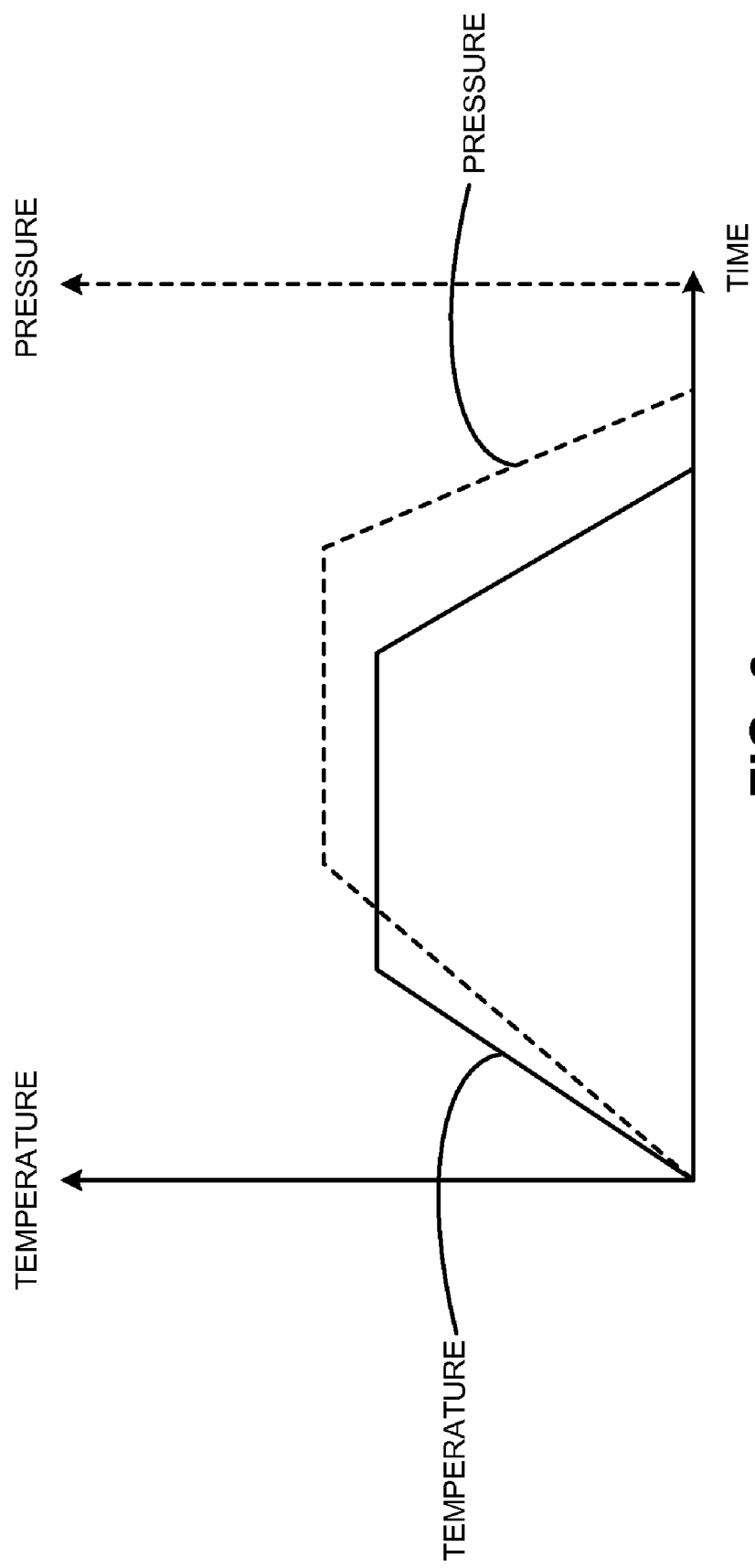
FIG. 6 presents a graph illustrating the behavior of a temperature-dependent pressure-applying mechanism which can be used on a carrier for a solder reflow process in accordance with an embodiment of the present invention.

FIG. 5B illustrates an exemplary carrier 503 for a solder reflow process in accordance with an embodiment of the present invention. FIG. 5B includes elements similar to elements illustrated in FIG. 5A, hence, only the differences are described. In FIG. 5B a temperature-dependent pressure-applying mechanism (e.g., clamps 504-505) can be used to apply pressure to the overlapped bond regions on the flexible PCBs during the solder reflow process. In some embodiments, the pressure-applying mechanism can include a material (e.g., material 506) which has a specified temperature-dependent expansion coefficient. Hence, in these embodiments, the pressure exerted by the pressure-applying mechanism can be a function of temperature. For example, FIG. 6 presents an exemplary graph illustrating the pressure exerted by a temperature-dependent pressure-applying mechanism which can be used on the carrier for a solder reflow process in accordance with an embodiment of the present invention. As illustrated in FIG. 6, as the temperature rises, the pressure applied by the carrier increases. As the temperature decreases, the pressure applied by the carrier remains constant until the temperature decreases below a specified temperature, at which point the pressure applied by the carrier decreases.

Figure 7:
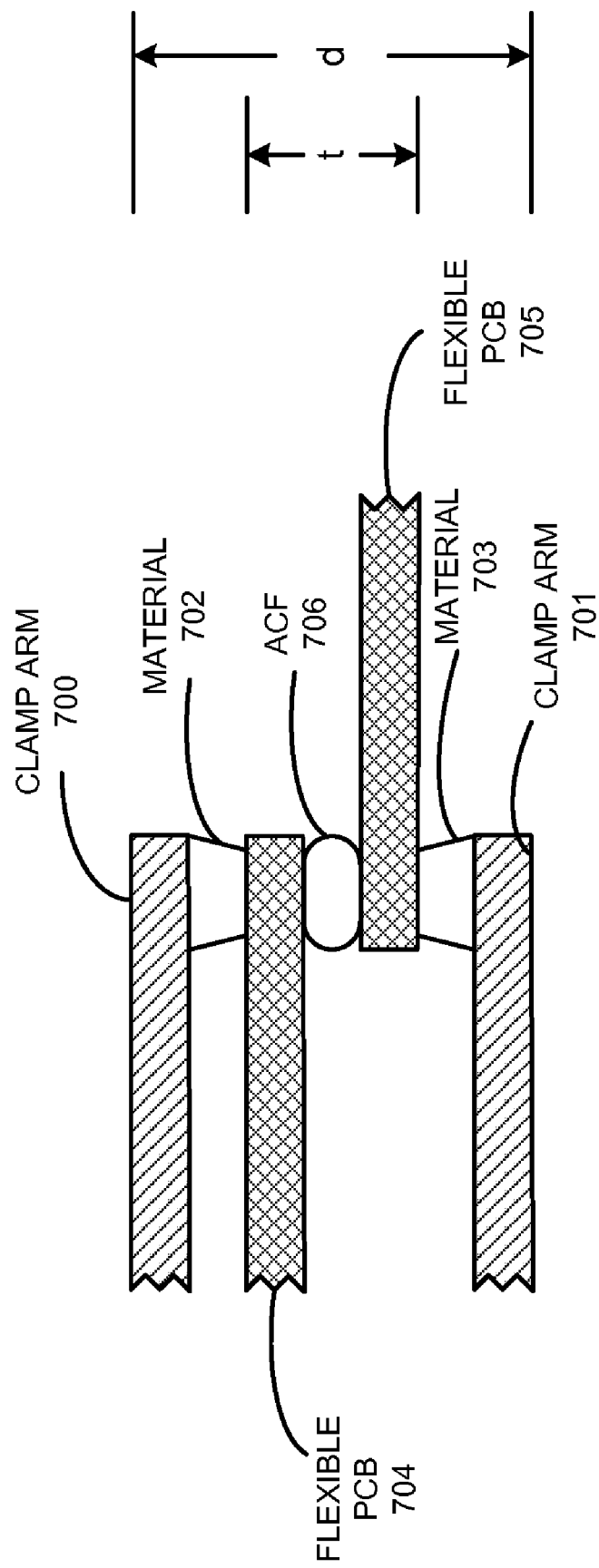
FIG. 7 presents an exemplary clamp which generates a temperature-dependent pressure in accordance with an embodiment of the present invention.

FIG. 7 presents an exemplary clamp which generates a temperature-dependent pressure in accordance with an embodiment of the present invention. The clamp include clamp arms 700-701, temperature-dependent materials 702-703, flexible PCBs 704-705, and ACF 706. Temperature-dependent materials 702-703 are chosen so that the clamp has a specified temperature-dependent expansion characteristic. Note that temperature-dependent materials 702-703 can be the same material or different materials. In some embodiments, temperature-dependent materials 702-703 can be chosen so that the distance d between the top of clamp arm 700 and the bottom of clamp arm 701 remain at a fixed distance d, while distance t between the top of flexible PCB 704 and the bottom of flexible PCB 705 changes as a specified function of temperature.

Figure 8:
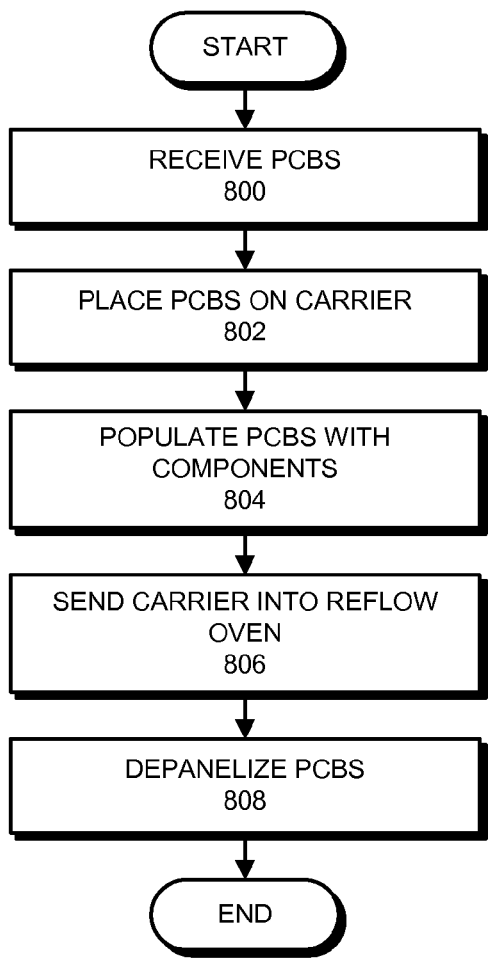
FIG. 8 presents a flow chart illustrating the process of manufacturing a PCB in accordance with an embodiment of the present invention.

FIG. 8 presents a flow chart illustrating the process of manufacturing a PCB in accordance with an embodiment of the present invention. Note that in these embodiments, the flexible PCBs (if there are any) have already been bonded to corresponding flexible PCBs. The process begins when the system receives one or more PCBs (step 800). Next, the process places the PCBs on a carrier (step 802). The process then populates the PCBs with components (step 804). Note that prior to populating the PCBs with components, the process can deposit solder onto conductive pads on the PCBs.

Next, the process sends the carrier into a reflow oven (step 806) wherein the solder can be reflowed so that components on the PCBs are mechanically and electrically coupled to the PCBs. The process then depanelizes the PCBs (step 808).

Figure 9:
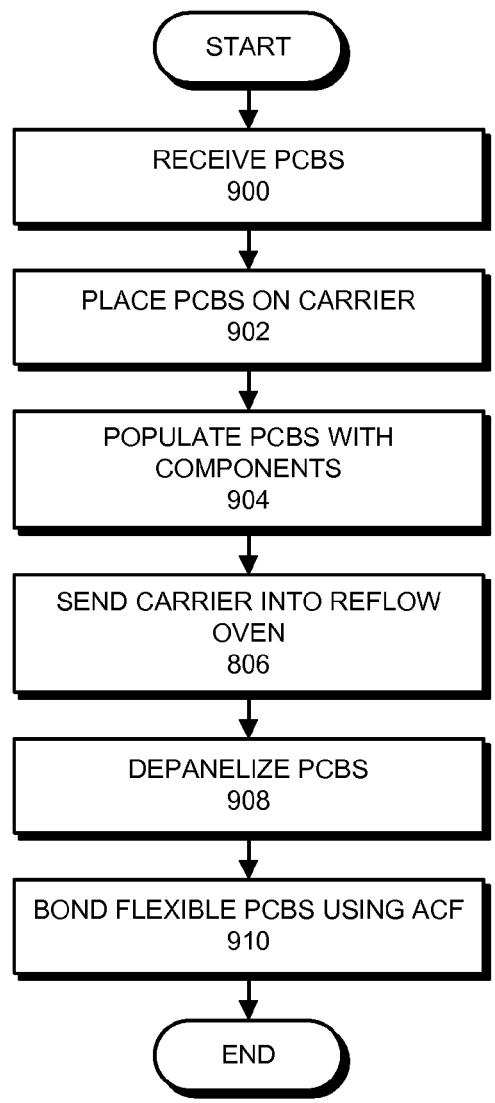
FIG. 9 presents a flow chart illustrating the process of manufacturing a PCB which includes flexible PCBs that are to be bonded together in accordance with an embodiment of the present invention.

FIG. 9 presents a flow chart illustrating the process of manufacturing a PCB which includes flexible PCBs that are to be bonded together in accordance with an embodiment of the present invention. The process begins when the system receives one or more PCBs (step 900). The process then places the PCBs on a carrier (step 902). Next, the process populates the PCBs with components (step 904). Note that prior to populating the PCBs with components, the process can deposit solder onto conductive pads on the PCBs. The process then sends the carrier into a reflow oven (step 906) wherein the solder can be reflowed so that components on the PCBs are mechanically and electrically coupled to the PCBs. Next, the process depanelizes the PCBs (step 908). The process then bonds the flexible PCBs using an ACF (step 910).

Figure 10:
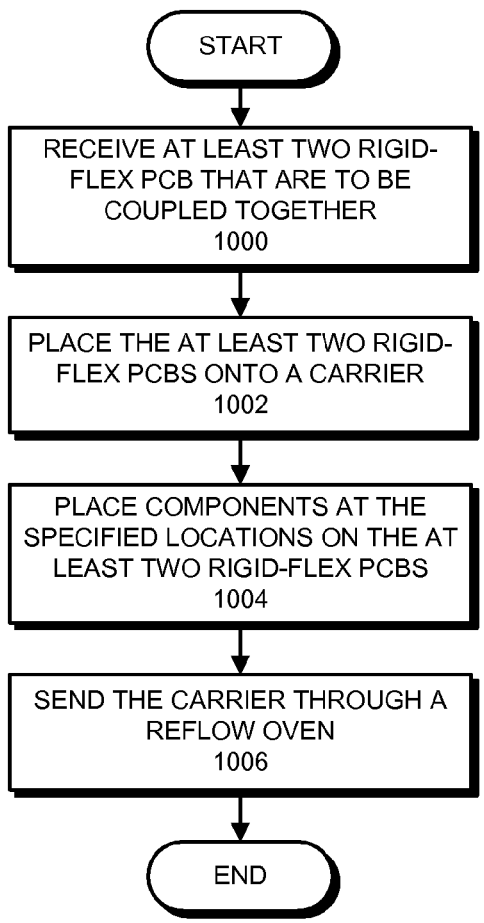
FIG. 10 presents a flow chart illustrating the process of manufacturing a hybrid rigid-flex PCB in accordance with an embodiment of the present invention.

FIG. 10 presents a flow chart illustrating the process of manufacturing a hybrid rigid-flex PCB in accordance with an embodiment of the present invention. The process begins when the system receives at least two rigid-flex PCB that are to be coupled together (step 1000), wherein a rigid-flex PCB includes at least one flexible PCB coupled to at least one rigid PCB. The process then places the at least two rigid-flex PCBs onto a carrier (step 1002) which can be configured to: align the at least two rigid-flex PCBs so that bond regions located on the flexible PCBs overlap with bond regions located on corresponding flexible PCBs, and apply pressure to the overlapped bond regions. Next, the process places components at the specified locations on the at least two rigid-flex PCBs (step 1004). In some embodiments, prior to placing the components at the specified locations, the process deposits solder onto conductive pads at specified locations on the PCBS. In these embodiments, leads for the components are placed on the deposited solder. The process sends the carrier through a reflow oven (step 1006) which can be configured to generate a temperature profile that reflows solder on the at least two rigid-flex PCBs so that the components become mechanically and electrically coupled to the at least two rigid-flex PCBs. In some embodiments, the temperature profile generated by the reflow oven and the pressure applied by the carrier cures and sets an anisotropic conductive film (ACF) located in the bond regions so that the overlapped flexible PCBs become mechanically and electrically coupled together.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for assembling a rigid-flex printed circuit board (PCB), comprising:
   receiving at least two rigid-flex PCBs that are to be coupled together, wherein each of the rigid-flex PCBs includes at least one flexible PCB coupled to at least one rigid PCB;
   placing the at least two rigid-flex PCBs onto a carrier which is configured to:
   align the at least two rigid-flex PCBs so that bond regions located on the flexible PCBs of each of the at least two rigid-flex PCBs overlap, and
   apply pressure to the overlapped bond regions;
   placing components at specified locations on the at least two rigid-flex PCBs; and sending the carrier through a reflow oven which is configured to generate a temperature profile that reflows solder on the at least two rigid-flex PCBs so that the components become mechanically and electrically coupled to the at least two rigid-flex PCBs;

wherein the temperature profile generated by the reflow oven and the pressure applied by the carrier cures and sets an anisotropic conductive film (ACF) located in the bond regions so that the overlapped flexible PCBs become mechanically and electrically coupled together.

2. The method of claim 1, wherein prior to placing the components, the method further comprises depositing solder on conductive pads at the specified locations on the at least two rigid-flex PCBs.

3. The method of claim 2, wherein placing components at the specified locations involves placing the components on the deposited solder.

4. The method of claim 1, wherein the pressure applied by the carrier is constant.

5. The method of claim 1, wherein the pressure applied by the carrier is a specified function of the temperature.

6. The method of claim 5, wherein as the temperature rises, the pressure applied by the carrier increases;

wherein as the temperature decreases, the pressure applied by the carrier remains constant until the temperature decreases below a specified temperature; and wherein after the temperature decreases to a specified temperature, the pressure applied by the carrier decreases.

7. The method of claim 1, wherein the carrier includes a pressure applying mechanism which includes one or more of:

a screw;
a wing nut;
a latch; and
a clamp.

* * * * *